United States Patent
Su et al.

(10) Patent No.: US 9,957,978 B2
(45) Date of Patent: May 1, 2018

(54) VENTILATION SYSTEM AND VENTILATION FAN HOUSING THEREOF

(71) Applicant: Sunonwealth Electric Machine Industry Co., Ltd., Kaohsiung (TW)

(72) Inventors: Chia-Hung Su, Kaohsiung (TW); Chi-Hung Kuo, Kaohsiung (TW); Tui-Lin Jen, Kaohsiung (TW); Shih-Chieh Yen, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 496 days.

(21) Appl. No.: 14/693,940

(22) Filed: Apr. 23, 2015

(65) Prior Publication Data

US 2015/0354595 A1   Dec. 10, 2015

(30) Foreign Application Priority Data

Jun. 9, 2014   (CN) .......................... 2014 1 0250998

(51) Int. Cl.
| | |
|---|---|
| *F04D 25/08* | (2006.01) |
| *F04D 29/42* | (2006.01) |
| *F04D 29/60* | (2006.01) |
| *F04D 29/62* | (2006.01) |
| *F24F 1/56* | (2011.01) |
| *F24F 13/20* | (2006.01) |

(Continued)

(52) U.S. Cl.
CPC ........... *F04D 29/624* (2013.01); *F04D 25/08* (2013.01); *F04D 29/4226* (2013.01); *F04D 29/601* (2013.01); *F24F 1/56* (2013.01); *F24F 13/20* (2013.01); *H05K 5/0004* (2013.01); *H05K 5/0221* (2013.01); *H05K 5/0239* (2013.01); *F24F 2013/205* (2013.01)

(58) Field of Classification Search
CPC ............. F04D 29/4226; F04D 29/4233; F04D 29/424; F04D 29/4246; F04D 29/4253; F04D 29/601; F04D 29/624; F04D 25/0613; F04D 25/08; F04D 25/12; F04D 25/14; F04D 29/602; F04D 29/603; F04D 29/626; F24F 1/56; F24F 13/20; F24F 2013/202; F24F 2013/205; H05K 5/0004; H05K 5/0008; H05K 5/0013; H05K 5/0221; H05K 5/0226; H05K 5/0239
See application file for complete search history.

(56) References Cited

U.S. PATENT DOCUMENTS

| | | | | |
|---|---|---|---|---|
| 2,216,420 A | * | 10/1940 | Rose .......................... | E06B 7/04 256/19 |
| 4,252,547 A | * | 2/1981 | Johnson .................. | B01D 46/10 261/104 |

(Continued)

FOREIGN PATENT DOCUMENTS

CN        102818096 A        12/2012

*Primary Examiner* — Jason Shanske
*Assistant Examiner* — Christopher R Legendre
(74) *Attorney, Agent, or Firm* — Alan D. Kamrath; Kamrath IP Lawfirm, P.A.

(57) ABSTRACT

A ventilation fan housing includes: a shield body having a receiving space, a maintenance opening and a wire-positioning opening adjacent to the maintenance opening, with the maintenance opening and wire-positioning opening penetrating a wall of the shield body and communicating with the receiving space, and with a lid connecting with the shield body detachably to cover the maintenance opening.

9 Claims, 9 Drawing Sheets

(51) Int. Cl.
  *H05K 5/00*    (2006.01)
  *H05K 5/02*    (2006.01)

(56) References Cited

U.S. PATENT DOCUMENTS

| | | | | |
|---|---|---|---|---|
| 4,336,749 | A * | 6/1982 | Barnhart | F24F 13/20 |
| | | | | 248/58 |
| 4,867,640 | A * | 9/1989 | Penlesky | F04D 29/626 |
| | | | | 415/204 |
| 4,900,346 | A * | 2/1990 | Lutz | B01D 53/0407 |
| | | | | 55/385.2 |
| 6,585,486 | B2 * | 7/2003 | Birdsell | F04D 29/601 |
| | | | | 415/213.1 |
| 8,961,126 | B1 * | 2/2015 | Tom | F24F 13/078 |
| | | | | 362/368 |
| 9,746,196 | B2 * | 8/2017 | Su | F24F 7/007 |
| 2013/0130612 | A1 | 5/2013 | Penlesky et al. | |
| 2015/0184878 | A1 * | 7/2015 | Su | F24F 7/007 |
| | | | | 415/206 |
| 2015/0354595 | A1 * | 12/2015 | Su | F04D 29/4226 |
| | | | | 415/201 |

* cited by examiner

VENTILATION SYSTEM AND VENTILATION FAN HOUSING THEREOF

BACKGROUND OF THE INVENTION

1. Field of the Invention

The present invention generally relates to a ventilation system and a ventilation fan housing thereof and, more particularly, to a ventilation system with a ventilation fan housing having a maintenance opening and a wire-positioning opening.

2. Description of the Related Art

Figure 1:
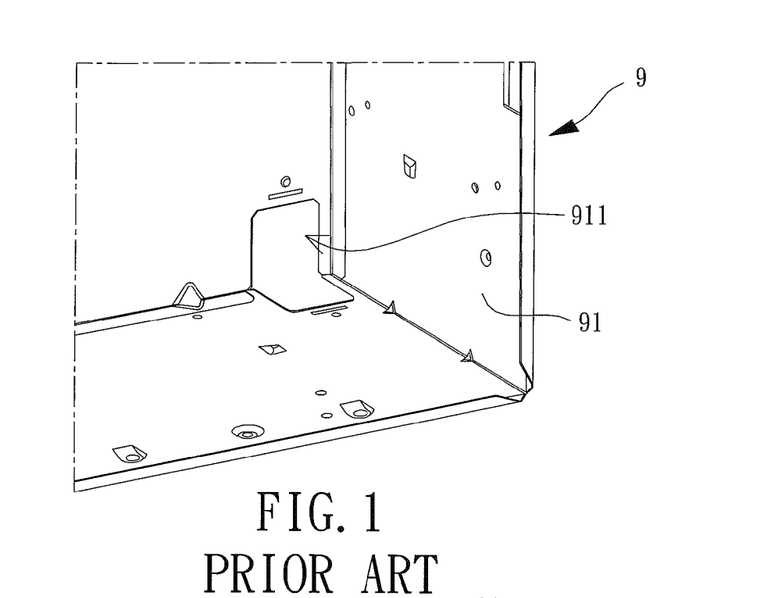
FIG. 1 is a partially-enlarged and perspective view of a conventional ventilation fan housing.

Referring to FIG. 1, a conventional ventilation system with a reference number of "9," of China publication number 103123158 entitled "Ventilation System and Assembly Method Thereof" is shown. The ventilation system 9 includes a housing 91 for receiving a fan, and the housing 91 has a maintenance opening 911. Therefore, the ventilation system 9 can provide the ventilating function when the fan operates. The maintenance opening 911 is for electric terminals and wires to extend through during installation of the ventilation system 9, so that electrical elements inside and outside the housing 91 can be electrically connected. Furthermore, the maintenance opening 911 can also serve as an opening for cleaning and maintenance of elements inside the housing 91.

Figure 2:
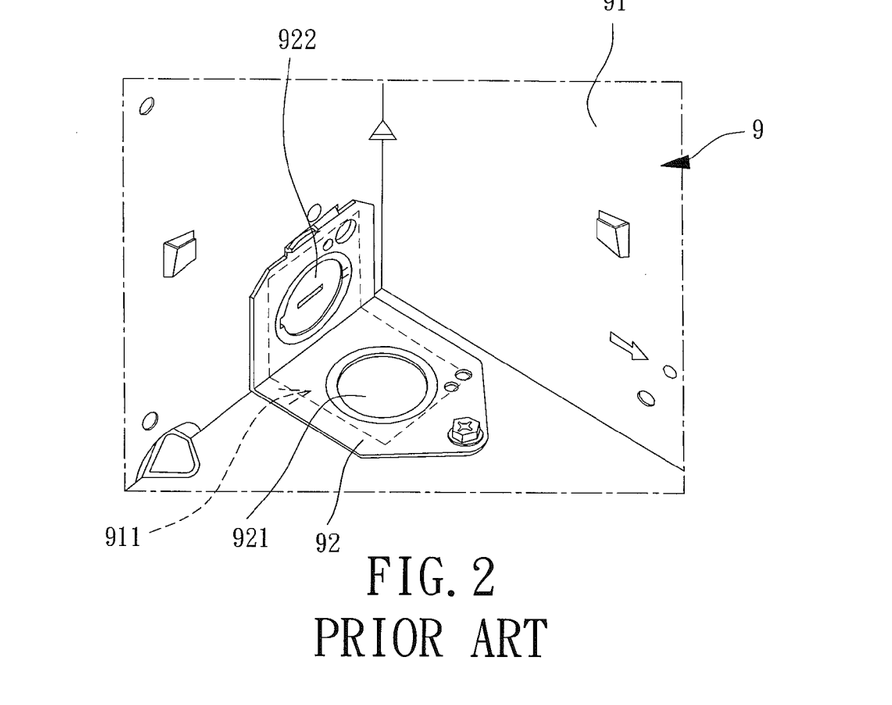
FIG. 2 is a partially-enlarged and perspective view of a conventional ventilation fan housing including a lid.

Referring to FIG. 2, the ventilation system 9 may further have a lid 92 coupling with the housing 91 and adapted to cover the maintenance opening 911, to avoid accumulation of unwanted matters such as dust inside the housing 91. Moreover, the lid 92 has two positioning holes 921, 922 for the electric terminals and wires to pass through. Specifically, each of the positioning holes 921, 922 is smaller than the maintenance opening 911.

However, when a worker has to disengage the lid 92 from the housing 91 for cleaning or maintaining the elements inside the housing 91, it is hard to disengage the lid 92 from the housing 91 since the electric terminals and wires still pass through and are positioned in the positioning holes 921, 922 of the lid 92. Besides, even though the lid 92 can be disengaged from the housing 91, it is still hard for the worker to perform the maintenance work because the electric terminals and wires block the maintenance opening 911, and the worker may easily disconnect the electric terminals or wires from the elements. Therefore, an improved housing of a ventilation system is in need.

SUMMARY OF THE INVENTION

What is needed is a ventilation fan housing, which has a shield body with a maintenance opening and a wire-positioning opening adjacent to the maintenance opening, while a lid connects with the shield body detachably to cover the maintenance opening, to improve convenience in use.

Another need is a ventilation system including the ventilation fan housing, so that the wire-positioning opening can be passed through by electric terminals and wires in assembly for electrically connecting elements inside and outside the shield body. Thus, a worker may easily clean or maintain the fan or other electronic elements inside the shield body via the maintenance opening.

In one implementation, a ventilation fan housing includes: a shield body having a receiving space, a maintenance opening and a wire-positioning opening adjacent to the maintenance opening, with the maintenance opening and wire-positioning opening penetrating a wall of the shield body and communicating with the receiving space, and with a lid connecting with the shield body detachably to cover the maintenance opening.

In this implementation, one or more of the following features may be included that: the shield body comprises a first plate and a second plate connecting with each other to form the receiving space, and the maintenance opening is arranged across a border between the first and second plates; the lid comprises a first part and a second part connecting to the first plate and second plate respectively, to completely cover the maintenance opening; the shield body has another wire-positioning opening so that the wire-positioning openings are a first wire-positioning opening and a second wire-positioning opening, the first wire-positioning opening is located in the first plate in a position adjacent to the maintenance opening, and the second wire-positioning opening is located in the second plate in another position adjacent to the maintenance opening; the shield body includes a first plate, a second plate, and a third plate connecting with each other, the first plate connects with the second plate and third plate respectively, the second plate further connects with the third plate, the first, second and third plates jointly form the receiving space, and the maintenance opening is arranged at a corner where the first, second and third plates connect with each other; the lid comprises a first part, a second part and a third part, the first part connects with the second part and third part respectively, the second part further connects with the third part, and the first, second and third parts connect with the first, second and third plates respectively to cover the maintenance opening completely; the shield body further has a third wire-positioning opening locating in the third plate in still another position adjacent to the maintenance opening; the wire-positioning opening has a diameter between 10 mm and 30 mm; the shield body has a first coupling portion, the lid has a second coupling portion, and the first and second coupling portions couple with each other to detachably link the lid and shield body; a blocking member connects with an inner wall of the wire-positioning opening and blocks the wire-positioning opening; a ventilation system comprising the ventilation fan housing has a fan received in the receiving space of the shield body; the ventilation system further comprises a cover, with the cover coupling with the shield body and having a plurality of guiding fins, with each guiding fin having an end portion and an extending portion at two ends in a vertical direction perpendicular to a surface of the cover, any adjacent two of the guiding fins are spaced out by a slit in a predetermined direction parallel to the surface of the cover, the extending portion of any one of the guiding fins extends to an adjacent one of the guiding fins to conceal the slit in the predetermined direction, and the slit serves as an air inlet of the cover.

BRIEF DESCRIPTION OF THE DRAWINGS

The present invention will become more fully understood from the detailed description given hereinafter and the accompanying drawings which are given by way of illustration only, and thus are not limitative of the present invention, including.

In the various figures of the drawings, the same numerals designate the same or similar parts. Furthermore, when the terms "first," "second," "third," "fourth," "inner," "outer," "top," and similar terms are used hereinafter, it should be understood that these terms refer only to the structure shown in the drawings as it would appear to a person viewing the drawings, and are utilized only to facilitate describing the invention.

DETAILED DESCRIPTION OF THE INVENTION

Figure 3:
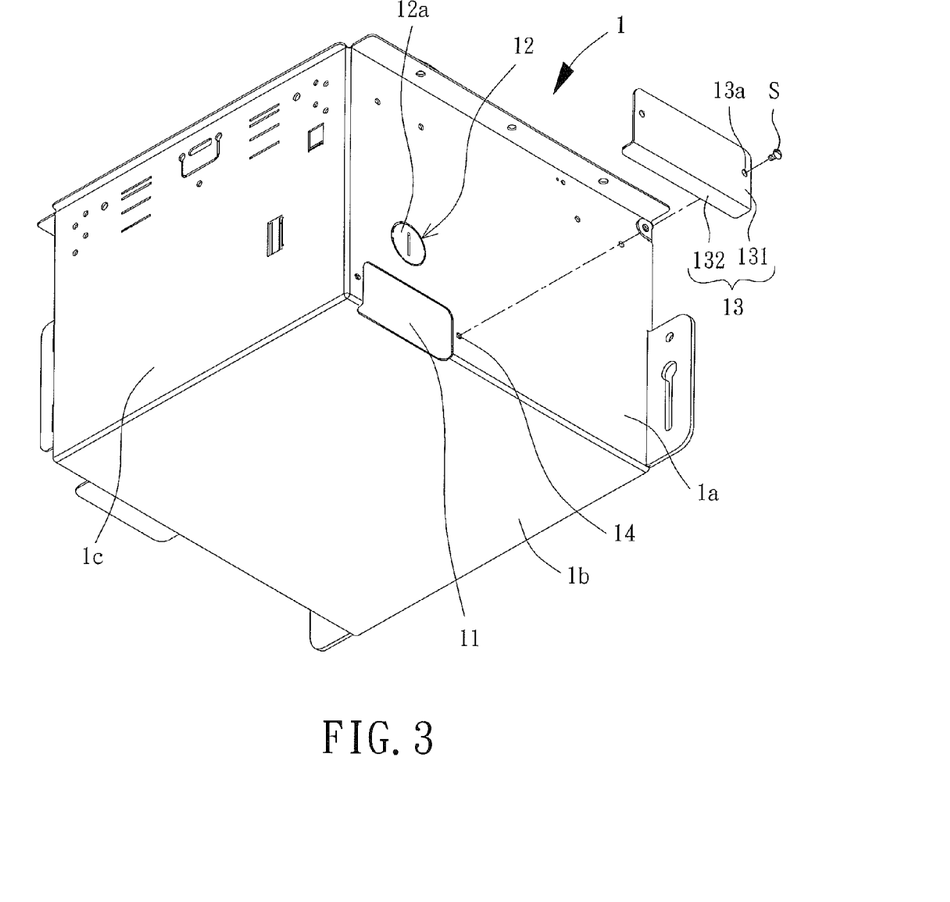
FIG. 3 is a perspective and exploded view of a ventilation fan housing in accordance with a first embodiment of the present invention.

Referring to FIG. 3, the ventilation fan housing of a first embodiment of this invention is shown. The ventilation fan housing includes a shield body 1 having a maintenance opening 11 and a wire-positioning opening 12 adjacent to the maintenance opening 11. A lid 13 connects with the shield body 1 and covers the maintenance opening 11, and the lid 13 may detachably connect with the shield body 1.

Figure 4:
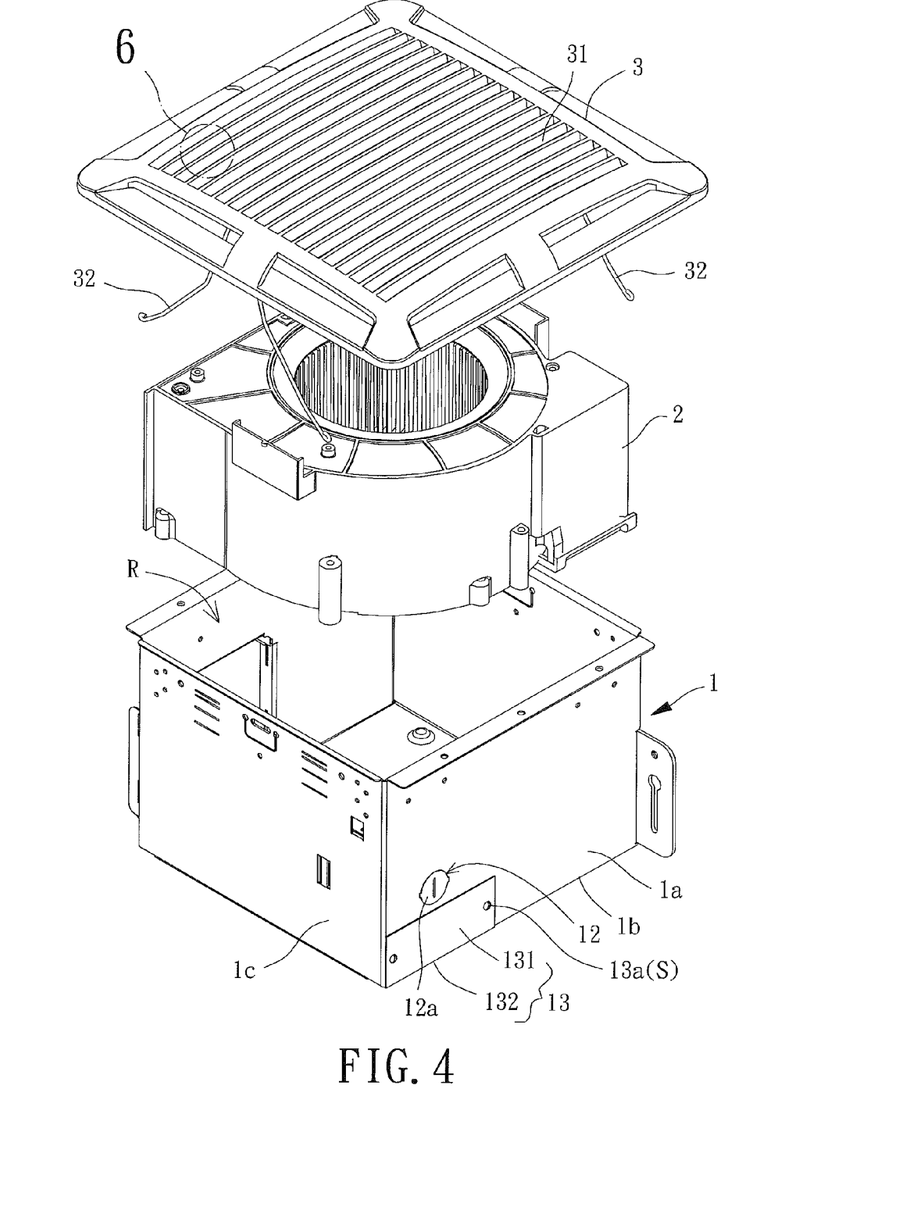
FIG. 4 is a perspective and exploded view of a ventilation system including the ventilation fan housing of the first embodiment.

Specifically, referring to FIG. 4 as well, the shield body 1 includes a first plate 1a, a second plate 1b, and a third plate is connecting with each other. Namely, the first plate 1a connects with the second plate 1b and third plate 1c respectively, and the second plate 1b further connects with the third plate 1c. Besides, included angles respectively between the first and second plates 1a, 1b, between the second and third plates 1b, 1c, and between the first and third plates 1a, 1c may be 90-degree angles. Therefore, the plates 1a, 1b, 1c can jointly form a receiving space "R" for receiving a fan 2.

Both of the maintenance opening 11 and wire-positioning opening 12 penetrate the wall of the shield body 1 and communicate with the receiving space "R." In this embodiment, the maintenance opening 11 is arranged across a border between the first and second plates 1a, 1b, and the wire-positioning opening 12 is arranged in either one of the first and second plates 1a, 1b. Preferably, the wire-positioning opening 12 has a diameter between 10 mm and 30 mm for electric terminals and wires to pass through. Conventionally, the wires may be bundled in a PVC tube, a flexible hose, or any other kind of tube.

The lid 13 includes a first part 131 and a second part 132 connecting to the first plate 1a and second plate 1b respectively, to completely cover the maintenance opening 11. Specifically, the shield body 1 may have a first coupling portion 14, and the lid 13 may have a second coupling portion 13a, with the first and second coupling portions 14, 13a coupling with each other to link the lid 13 and shield body 1. The first coupling portion 14 may be arranged close to the maintenance opening 11. For example, with the maintenance opening 11 arranged across the border between the first and second plates 1a, 1b in this embodiment, the first coupling portion 14 may be formed in the first plate 1a and the second coupling portion 13a is in the first part 131 correspondingly. However, alternatively, in this embodiment, the first coupling portion 14 may be formed in the second plate 1b, and the second coupling portion 13a is in the second part 132 correspondingly.

The first coupling portion 14 may be a positioning hole, the second coupling portion 13a may be a through hole in alignment with the positioning hole, and a fixing member "S" extends through the through hole and fixes with the wall of the positioning hole. Alternatively, in addition to the above screwing structure, the first and second coupling portions 14, 13a may also be formed by other detachable designs, such as hooking, or dovetail, for detachably combining the shield body 1 and the lid 13 as well as avoiding the lid 13 disengaging from the shield body 1 when they are combined with each other.

In practical use, referring to FIG. 4, the fan 2 is received in the shield body 1, that is, in the receiving space "R" formed by the plates 1a, 1b, 1c, and the shield body 1 may further combine with a cover 3 sealing the receiving space "R." Therefore, the fan 2 can serve as a ventilation fan, and the shield body 1, the fan 2 and the cover 3 jointly complete a ventilation system capable of air ventilation.

Figure 5:
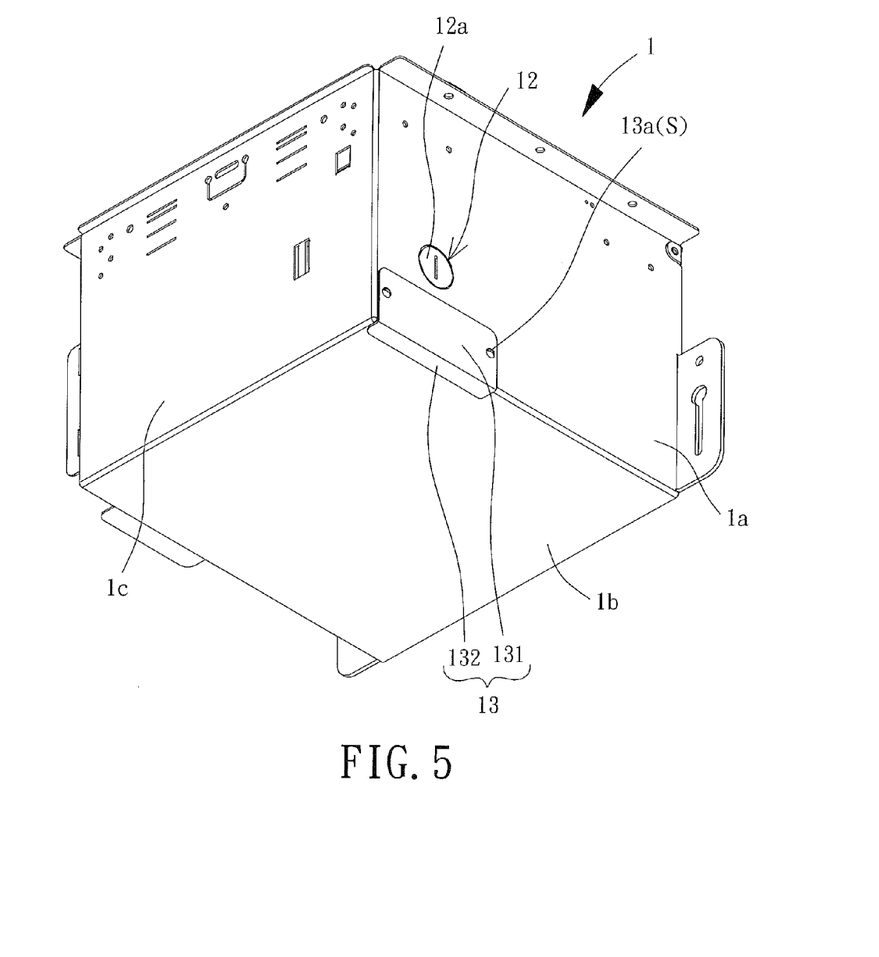
FIG. 5 is a perspective view of the ventilation fan housing of the first embodiment including a blocking member arranged in a wire-positioning opening.

Referring to FIG. 5, the wire-positioning opening 12 is adapted for electric terminals and wires to pass through and to link electrical elements inside and outside the shield body 1, and the lid 13 connects with the shield body 1 for covering the maintenance opening 11. When a worker has to clean or maintain the elements inside the shield body 1, the worker only needs to disengage the lid 13 from the shield body 1, to perform the cleaning or maintenance via the maintenance opening 11 for the fan 2 or other electronic elements inside the shield body 1. Since the wire-positioning opening 12 is close to the maintenance opening 11 and adapted for the electric terminals and wires to pass through, the wires connecting with the fan 2 or other electronic elements are easy to be checked and maintained. Besides, the process of cleaning or maintenance work is not affected by the wires connecting with the fan 2 or other electronic elements because there is no wire passing through the maintenance opening 11. Thus, the possibility of disconnecting any wire connecting with the fan 2 or other electronic elements during the process of cleaning or maintenance work is also lowered.

Additionally, referring to FIG. 5 again, there can be a blocking member 12a arranged in and blocking the wire-positioning opening 12, to conceal the wire-positioning opening 12 and depart the receiving space "R" from the space outside the shield body 1 before a need of extending the wire through the wire-positioning opening 12. Specifically, the blocking member 12a may connect with an inner wall of the wire-positioning opening 12, with a groove formed at the border of the blocking member 12a connecting to the inner wall, so that the blocking member 12a can be easily removed. Alternatively, the blocking member 12a may connect with the inner wall by detachable ways such as screwing for easy removal.

Figure 6:
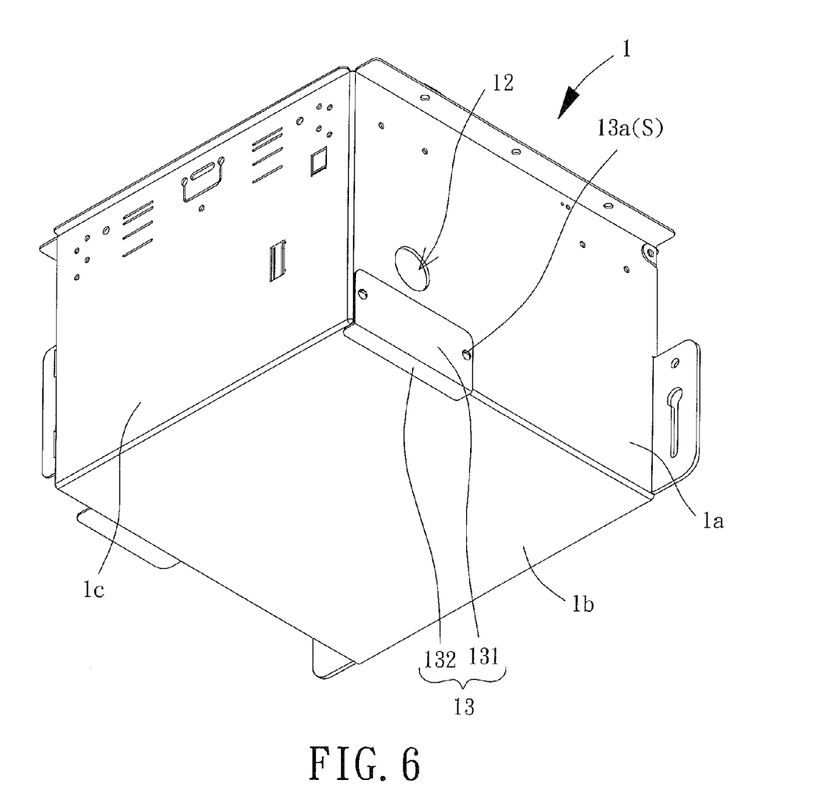
FIG. 6 is a perspective view of the ventilation fan housing of the first embodiment with the blocking member removed.

Particularly, referring to FIG. 6 now, if any electric terminal, wire or electrical line has to extend through the wire-positioning opening 12 during assembly of the ventilation system, the blocking member 12a can be removed.

Thus, the electric terminal, wire or electrical line can extend through the wire-positioning opening 12 and enter the receiving space "R."

Figure 7:
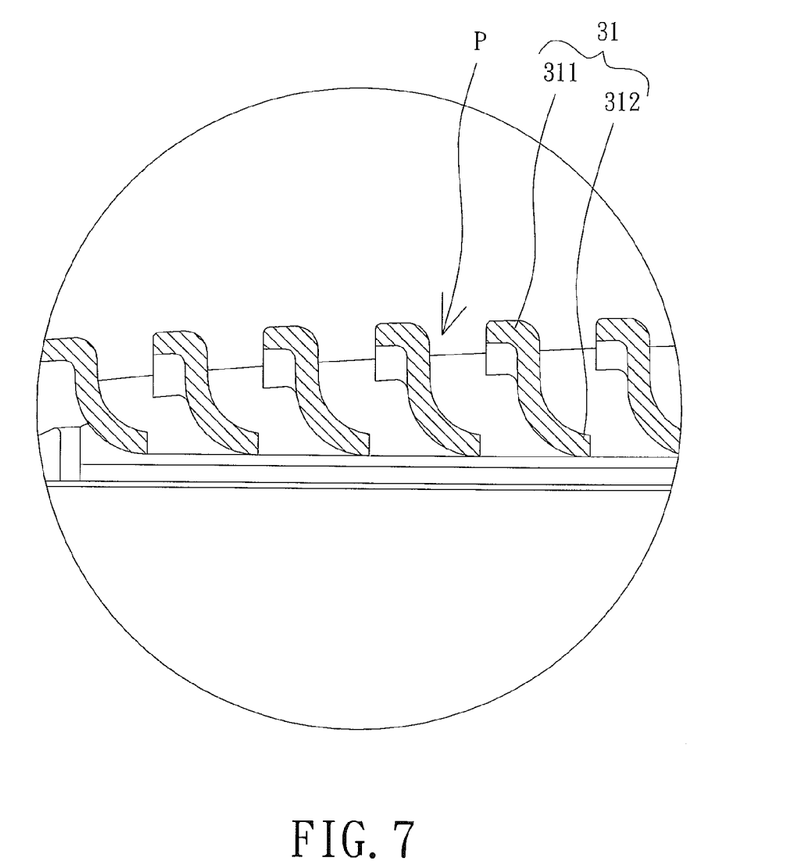
FIG. 7 is a partially-enlarged and cross-sectional view of a cover of the ventilation system.

Referring to FIGS. 4 and 7 now, in this ventilation system, the cover 3 further includes a plurality of guiding fins 31 with any adjacent two of the guiding fins 31 being spaced by a slit "P" in a predetermined direction parallel to a surface of the cover 3, so that the slit "P" may serve as an air inlet of the cover 3. Specifically, each guiding fin 31 has an end portion 311 and an extending portion 312 at two ends in a vertical direction perpendicular to the surface of the cover 3, with the end portion 311 and extending portion 312 connecting to each other. The extending portion 312 of any one of the guiding fins 31 extends to an adjacent one of the guiding fins 31, to conceal the slit "P" in the predetermined direction. As a result, the slits "P" are vertically hidden, and, thus, a slit-less look from top of the cover 3 is formed. This design can also decrease the possibility of dust attachment.

Referring to FIG. 4 again, outer edges of the cover 3 may have a plurality of hooking members 32 for connecting with the shield body 1, to link the cover 3 and the shield body 1 detachably. These hooking members 32 not only efficiently decrease the complexity of elements for combining the shield body 1 and cover 3, but also provide an easy detachment for the cover 3 from the shield body 1.

Figure 8:
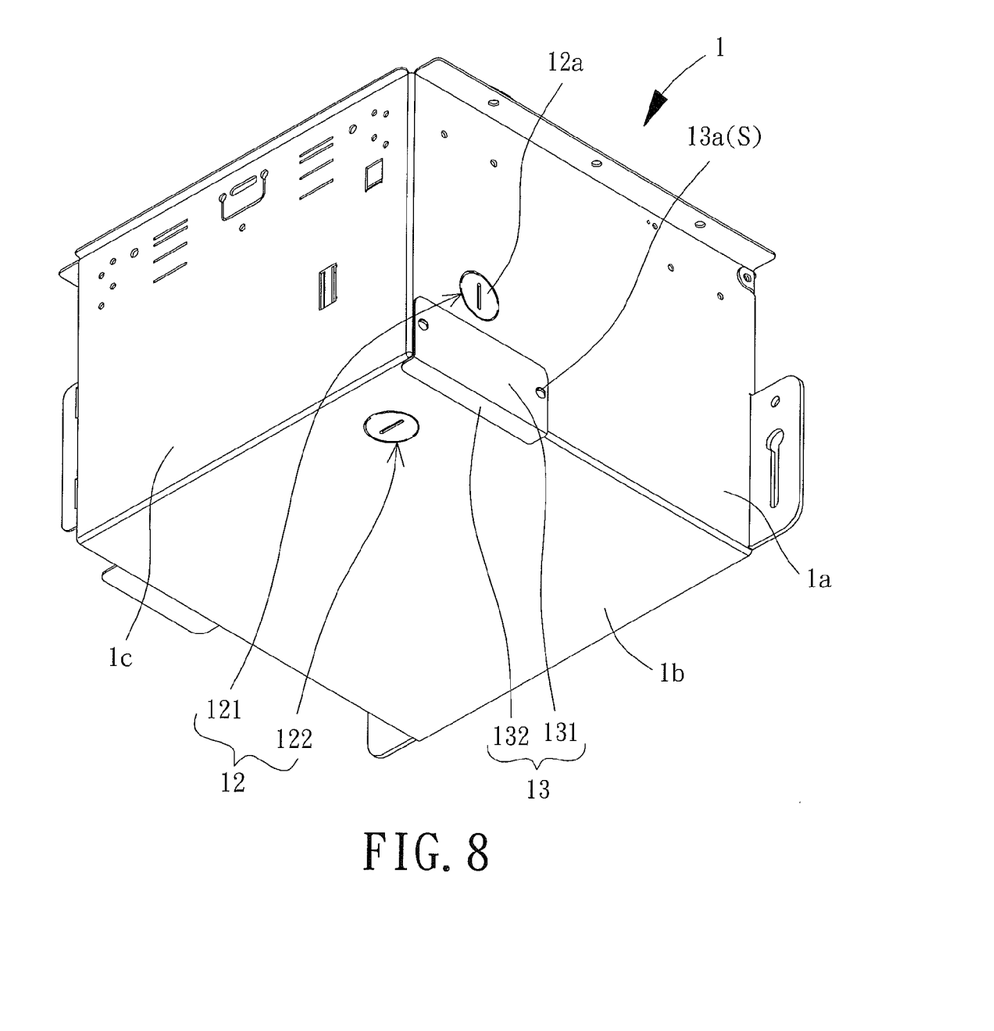
FIG. 8 is a perspective view of a ventilation fan housing in accordance with a second embodiment of the present invention.

Referring to FIG. 8, the ventilation fan housing of a second embodiment of this invention is shown. The difference between this embodiment and the previous one lies in that there is a plurality of wire-positioning openings 12. Specifically, in this embodiment, the shield body 1 has a first wire-positioning opening 121 and a second wire-positioning opening 122. The first wire-positioning opening 121 is located in the first plate 1a in a position adjacent to the maintenance opening 11, and the second wire-positioning opening 122 is located in the second plate 1b in another position adjacent to the maintenance opening 11. Therefore, the plurality of wire-positioning openings 12 may help the arrangement of the wires connecting with the fan 2 or other electric elements in the shield body 1, and thus efficiently improve the use of the receiving space "R" of the shield body 1.

Particularly, there can be blocking members 12a arranged in and blocking the first and second wire-positioning openings 121, 122 respectively, to conceal the first and second wire-positioning openings 121, 122. With the above arrangement, when the ventilation fan housing of this embodiment is used in a ventilation system, the blocking member 12a blocking the second wire-positioning openings 122 is not removed if wires only need to extend through the first wire-positioning opening 121, and vice versa. Accordingly, the remained blocking member 12a can still prevent dust or an external object from entering the shield body 1.

Figure 9:
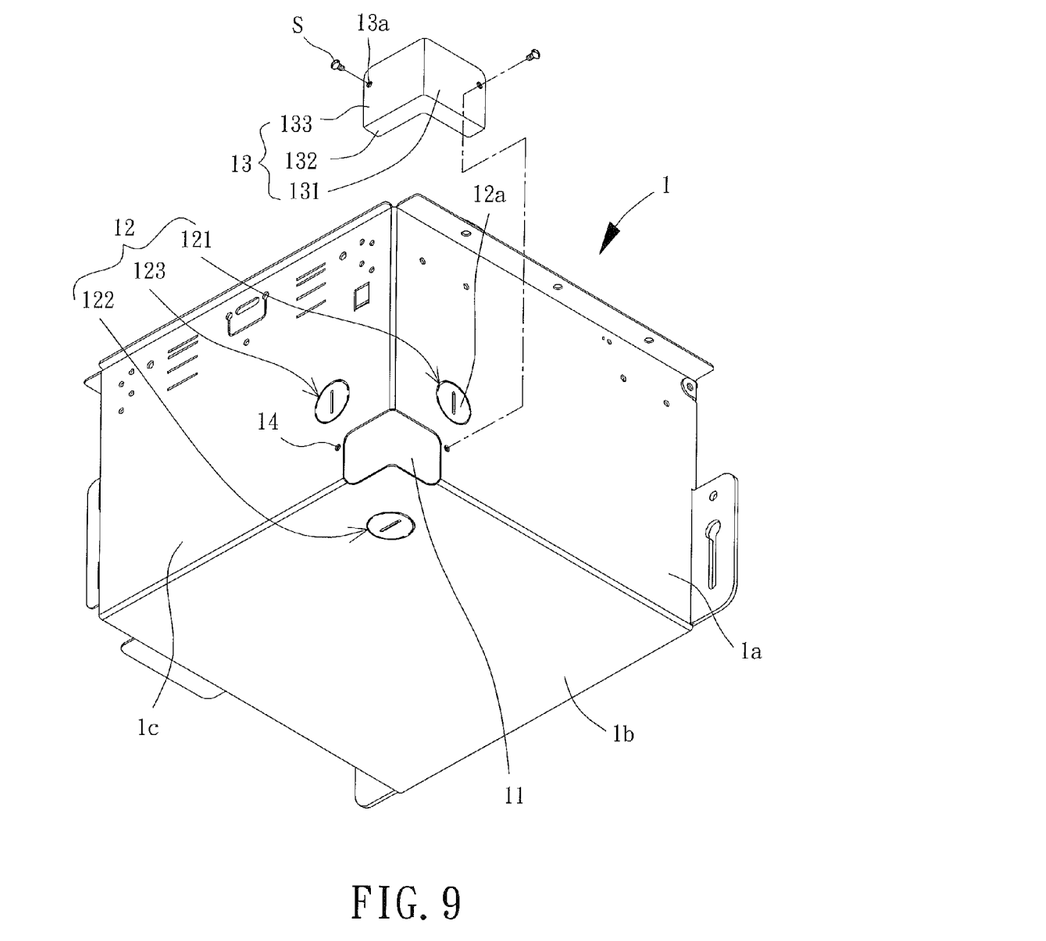
FIG. 9 is a perspective and exploded view of a ventilation fan housing in accordance with a third embodiment of the present invention.

Referring to FIG. 9, the ventilation fan housing of a third embodiment of this invention is shown. The difference between this embodiment and the first embodiment lies in that the maintenance opening 11 is arranged across borders between the first, second and third plates 1a, 1b, 1c, that is, at a corner where the first, second and third plates 1a, 1b, 1c connect with each other. Correspondingly, the lid 13 of this embodiment includes a first part 131, a second part 132 and a third part 133 connecting with each other. Namely, the first part 131 connects with the second part 132 and third part 133 respectively, and the second part 132 further connects with the third part 133. Besides, included angles respectively between the first and second parts 131, 132, between the second and third parts 132, 133, and between the first and third parts 131, 133 may be 90-degree angles. The first, second and third parts 131, 132, 133 connect with the first, second and third plates 1a, 1b, 1c respectively, to completely cover the maintenance opening 11.

The shield body 1 of this embodiment may have a plurality of wire-positioning openings 12, similar to the shield body 1 of the second embodiment. Specifically, there are a first wire-positioning opening 121, a second wire-positioning opening 122, and a third wire-positioning opening 123 in the shield body 1. The first wire-positioning opening 121 is located in the first plate 1a in a position adjacent to the maintenance opening 11, the second wire-positioning opening 122 is located in the second plate 1b in another position adjacent to the maintenance opening 11, and the third wire-positioning opening 123 is located in the third plate 1c in still another position adjacent to the maintenance opening 11. With the above position arrangement of the maintenance opening 11, use of the wire-positioning openings 12 and arrangement of the wires extending therethrough can be flexible further. Namely, there are more selections of the wire-positioning openings 12 for users to choose.

Besides, in addition to a mere arrangement of the fan 2 for a basic ventilation function, the ventilation system may also be required to provide extra functions, such as auto-start according to external movement or humidity, illumination serving as an adjustable light or an emergency light, remote control, time delay control, music play, environment heating, air condition, dehumidification, and wind speed control. Therefore, with the maintenance opening 11 arranged across borders between the first, second and third plates 1a, 1b, 1c and the flexible use of the wire-positioning openings 12 in the first, second and third plates 1a, 1b, 1c, it is easy to arrange the positions of the fan 2 and the other elements for providing the above mentioned functions, such as a lamp, a sensor, a signal receiver, a heater, a compressor, or an amplifier in the receiving space "R."

Figure 10:
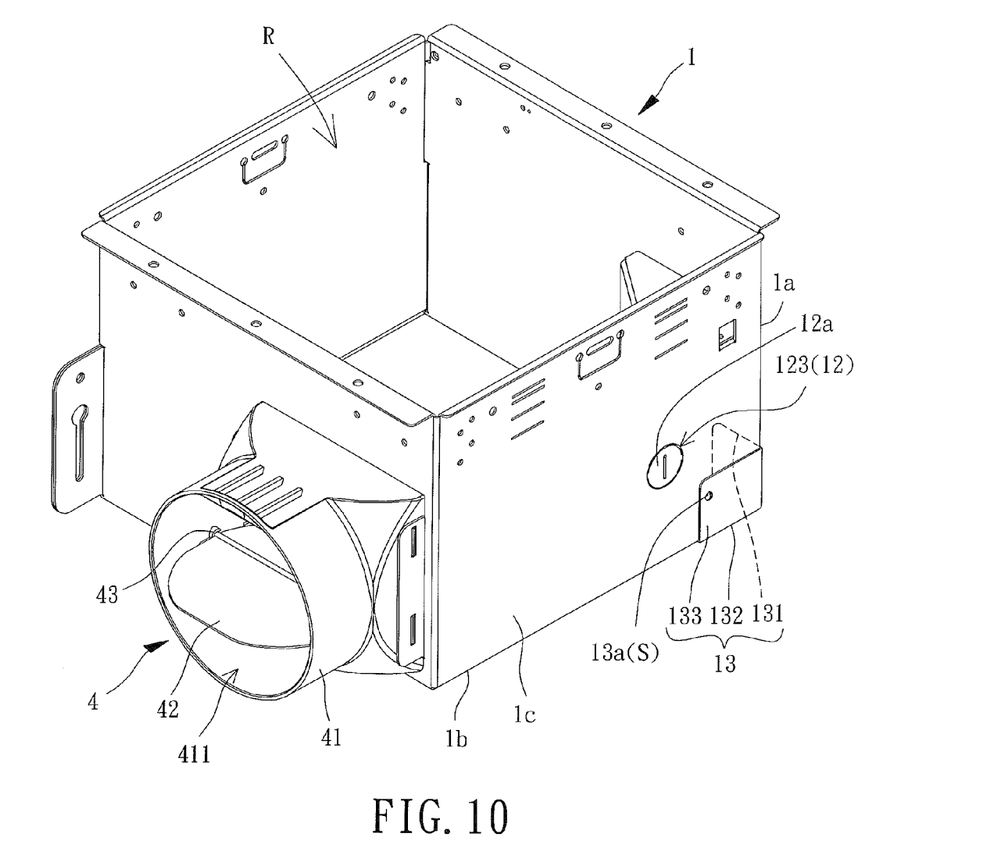
FIG. 10 is a perspective view of a ventilation fan housing in accordance with a fourth embodiment of the present invention.

Referring to FIG. 10, the ventilation fan housing of a fourth embodiment of this invention is shown. The difference between this embodiment and the third embodiment lies in that the shield body 1 further connects to an air-guiding member 4 including an air-guiding pipe 41. The air-guiding pipe 41 connects with the shield body 1 by an end and communicates with the receiving space "R." The air-guiding pipe 41 has an outlet 411 at another end opposite to the end connecting to the shield body 1, with the outlet 411 being adapted to outwardly guide air from the shield body 1. Preferably, there is a blocking board 42 mounted inside the air-guiding pipe 41 in a rotatable way, and the blocking board 42 can automatically seal the outlet 411 when no air goes through the air-guiding pipe 41 for anti-dust purposes. On the other hand, when air is expelled from the shield body 1 to the air-guiding pipe 41, the air pressure caused can push the blocking board 42 to rotate, so that the outlet 411 is thus open for the air to be further expelled out of the air-guiding member 4.

Furthermore, it is preferable that the blocking board 42 connects to the air-guiding pipe 41 via a one-way-rotating pivot 43. Accordingly, when an airflow is formed inside the shield body 1 toward the air-guiding pipe 41, the blocking board 42 can be rotated to reveal the outlet 411 to the receiving space "R." However, when an external airflow is formed and flows toward the outlet 411, the one-way-rotating pivot 43 can prevent the blocking board 42 from rotating reversely, to maintain the outlet 411 close and keep the external airflow away from the receiving space "R." As a result, the air-guiding member 4 can efficiently avoid polluted or oily air entering the receiving space "R" of the shield body 1.

Consequently, the ventilation fan housing of the present invention is characterized in the following features. The first shield body 1 has the maintenance opening 11 and the wire-positioning opening 12 adjacent to the maintenance opening 11. The lid 13 detachably connects with the shield body 1 to cover the maintenance opening 11. When the ventilation fan housing is used in a ventilation system, the wire-positioning opening 12 is adapted for electric terminals and wires to pass through and to link electrical elements inside and outside the shield body 1, and the lid 13 connects with the shield body 1 and covers the maintenance opening 11. When the worker has to clean or maintain the elements inside the shield body 1, he/she only needs to disengage the lid 13 from the shield body 1, to perform the cleaning or maintenance via the maintenance opening 11 for the fan 2 or other electronic elements inside the shield body 1.

Although the conventional ventilation system 9 also has the lid 92 used to cover the maintenance opening 911, the two positioning holes 921, 922 formed in the lid 92 result in difficulty in disengaging the lid 92 from the housing 91 when the worker has to clean or maintain the elements inside the housing 91 via the maintenance opening 911. Furthermore, even though the lid 92 can be disengaged from the housing 91, it is still hard for the worker to perform the maintenance work because the electric terminals and wires block the maintenance opening 911, and the worker may easily disconnect the electric terminals or wires from the elements. In comparison with this conventional ventilation system 9, the shield body 1 of the present invention has the maintenance opening 11 and wire-positioning opening 12 separately, while the wire-positioning opening 12 is adjacent to the maintenance opening 11. Accordingly, not only the fan 2 or other electronic elements can be arranged close to the maintenance opening 11 for the convenience of cleaning or maintenance, but also the possibility of inadvertent disconnection of the electric terminals or wires can largely decrease.

In sum, with the wire-positioning opening 12 adapted to let the electric terminals or wires extend through, with the maintenance opening 11 adapted to be opened for cleaning or maintenance process, and with the lid 13 connecting with the shield body 1 and adapted to cover the maintenance opening 11, the ventilation fan housing of the present invention can be efficiently applied to a ventilation system for improving convenience in use.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. A ventilation fan housing comprising:
a shield body having a receiving space, a maintenance opening and a first wire-positioning opening adjacent to the maintenance opening, with the maintenance opening and the first wire-positioning opening penetrating a wall of the shield body and communicating with the receiving space, wherein the shield body includes a first plate, a second plate, and a third plate connecting with each other, wherein the first, second and third plates jointly form the receiving space, wherein the maintenance opening is arranged in a corner including a portion of the first plate, a portion of the second plate, and a portion of the third plate, and
a lid connecting with the shield body detachably to cover the maintenance opening, wherein the lid comprises a first part, a second part and a third part, wherein the first part connects with the second part and third part respectively, wherein the second part further connects with the third part, wherein the first, second and third parts connect with the first, second and third plates respectively to cover the maintenance opening completely,
wherein the shield body has a second wire-positioning opening, wherein the first wire-positioning opening is located in the first plate in a position adjacent to the maintenance opening, and wherein the second wire-positioning opening is located in the second plate in another position adjacent to the maintenance opening.

2. The ventilation fan housing as claimed in claim 1, wherein the shield body further has a third wire-positioning opening locating in the third plate in still another position adjacent to the maintenance opening.

3. The ventilation fan housing as claimed in claim 1, wherein the first wire-positioning opening has a diameter between 10 mm and 30 mm.

4. The ventilation fan housing as claimed in claim 1, wherein the shield body has a first coupling portion, the lid has a second coupling portion, and the first and second coupling portions couple with each other to detachably link the lid and shield body.

5. The ventilation fan housing as claimed in claim 1, further comprising a blocking member connecting with an inner wall of the first wire-positioning opening and blocking the first wire-positioning opening.

6. A ventilation system, comprising the ventilation fan housing claimed in claim 1 and a fan, wherein the shield body receives the fan in the receiving space.

7. The ventilation system as claimed in claim 6, wherein the first wire-positioning opening of the shield body has a diameter between 10 mm and 30 mm.

8. The ventilation system as claimed in claim 6, further comprising a cover, wherein the cover couples with the shield body and has a plurality of guiding fins, wherein each of the plurality of guiding fins has an end portion and an extending portion at two ends in a vertical direction perpendicular to a surface of the cover, wherein any adjacent two of the plurality of guiding fins are spaced out by a slit in a predetermined direction parallel to the surface of the cover, wherein the extending portion of any one of the plurality of guiding fins extends to an adjacent one of the plurality of guiding fins to conceal the respective slit in the predetermined direction, and wherein each slit serves as an air inlet of the cover.

9. A ventilation fan housing comprising:
a shield body having a receiving space, a maintenance opening and a wire-positioning opening adjacent to the maintenance opening, with the maintenance opening and the wire-positioning opening penetrating the shield body and communicating with the receiving space, wherein the shield body includes a first plate, a second plate, and a third plate, wherein the first, second, and third plates connect with each other, wherein the first, second and third plates jointly form the receiving space, wherein the maintenance opening is defined in a corner including a portion of the first plate, a portion of the second plate, and a portion of the third plate, and
a lid connecting with the shield body detachably to cover the maintenance opening, wherein the lid comprises a first part, a second part and a third part, wherein the first part connects with the second part and third part respectively, wherein the second part further connects with the third part, and wherein the first, second and third parts detachably connect with the first, second and third plates respectively to cover the maintenance opening completely.

* * * * *